United States Patent [19]
Yamasaki et al.

[11] Patent Number: 5,561,524
[45] Date of Patent: Oct. 1, 1996

[54] INTERFEROMETRIC DISTANCE MEASURING APPARATUS UTILIZING AN ASYMMETRIC/ELLIPTIC BEAM

[75] Inventors: Shigeru Yamasaki, Saitama-ken; Masafumi Sueyoshi, Kanagawa-ken, both of Japan

[73] Assignee: Nikon Corporation, Tokyo, Japan

[21] Appl. No.: 364,193

[22] Filed: Dec. 27, 1994

[30] Foreign Application Priority Data

Dec. 27, 1993 [JP] Japan .................................. 5-331191
Jul. 20, 1994 [JP] Japan .................................. 6-167831
Nov. 8, 1994 [JP] Japan .................................. 6-273424

[51] Int. Cl.$^6$ .................................................. G01B 9/02
[52] U.S. Cl. ................................. 356/358; 356/363
[58] Field of Search ............................. 356/345, 351, 356/358, 349, 363

[56] References Cited

U.S. PATENT DOCUMENTS 4,650,330  3/1987  Fujita ........................... 356/349

FOREIGN PATENT DOCUMENTS 62-150721  7/1987  Japan .

*Primary Examiner*—Samuel A. Turner
*Assistant Examiner*—Robert Kim

*Attorney, Agent, or Firm*—Armstrong, Westerman, Hattori, McLeland & Naughton

[57] ABSTRACT

An interferometric distance measuring interferometer comprises a light source (11) for irradiating a main light beam (L), a beam splitting member (56) for splitting the main light beam into a first light beam (MR1, MR2) and a second light beam (MM1, MM2), a first reflection member (28) and second reflection member (14) for reflecting the first light beam and the second light beam, respectively, an optical composition member (25) for compositing the first light beam reflected by the first reflection member (28) and the second light beam reflected by the second reflection member (14), and a photoelectric converter (19) for receiving the composited light beam from the optical composition member. Whereby, a relative displacement between the first reflection member (28) and the second reflection member (14) is detected based on a photoelectric conversion signal from the photoelectric converter (19). The apparatus according to the present invention further comprises an asymmetric conversion member (12) for establishing the optical intensity distribution of a cross-section of at least one beam selected from a group of light beams including the main light beam (L) irradiated from the light source (11), the first light beam (MR1, MR2) and the second light beam (MM1, MM2). The asymmetric conversion member is arranged at at least one portion on an optical path of the light beam between the light source (11) and the photoelectric converter (19).

13 Claims, 8 Drawing Sheets

INTERFEROMETRIC DISTANCE MEASURING APPARATUS UTILIZING AN ASYMMETRIC/ELLIPTIC BEAM

BACKGROUND OF THE INVENTION

The present invention relates to an interferometric distance measuring apparatus so-called, an interferometer such as a laser interferometer which is used for measuring with high precision an amount of movement etc. of a stage device of an exposure apparatus for producing semiconductors or of a precision measuring instrument.

PRIOR ART

In an exposure apparatus for producing semiconductors, for example, an XY-stage is used in order to position a photosensitive substrate with high precision, wherein a laser interferometer is provided in order to measure the coordinate positions of the XY-stage with high precision. Further, in a precision measuring instrument or in a superprecision machine tool, a laser interferometer is provided in order to measure the coordinate positions of the stage which positions an object to be measured.

FIG. 12 shows a stage device provided with a prior laser interferometer. In FIG. 12, a laser beam L with a circular cross-sectional shape is irradiated from a laser light source 1 such as a He—Ne laser light source enters a polarization beam splitter 2. The laser beam L comprises two polarized light components (P-polarized light and S-polarized light), the direction of polarization of which are orthogonal to each other. A polarized light component polarized in the direction perpendicular to an incident surface, i.e. S-polarized light component, is reflected by the polarized beam splitter 2 and directed as a reference beam LR to a fixed mirror 4 through a ¼-wave plate This interferometer can be adapted for use with the heterodyne interference method or the homodyne interference method, wherein in the former a slight difference between frequencies of the two polarized light components is given and in the latter no difference therebetween is given. The reference beam LR, after being reflected by the reference mirror 4, passes through the ¼-wave plate 3R, and is transmitted as P-polarization light through the polarized beam splitter 2, and thereafter enters a receiver 7 including an analyzer and a photoelectric conversion element.

On the other hand, the other polarized light component polarized in the direction parallel to the incident surface, i.e. P-polarized light component, is transmitted through the polarization beam splitter 2 and directed as a measurement beam LM through the ¼-wave plate 3M to a movable mirror 5. The movable mirror 5 is limed to one end of the stage 6 which is movable along the Y-axis parallel to the optical axis of the measurement beam LM. The measurement beam LM reflected by the movable mirror 5, after passing through the ¼-wave plate 3M and then reflected as S-polarized light by the polarization beam splitter 2, enters the receiver 7 substantially coaxially with the reference beam LR. The receiver 7 conducts the photoelectric conversion of an interference light formed from the reference beam LR and the measurement beam LM, thereby generating digital pulses which correspond to an amount of movement of the movable mirror 5, e.g. in the Y-direction movement. By integrating these digital pulses, the amount of movement of the movable mirror 5 along the Y-axis can be measured.

In order to measure the amount of movement of the movable mirror 5 with a laser interferometer as described above, an interference region where the measurement beam LM and the reference beam LR are superposed must exist in the light receiving portion of the receiver 7.

With reference to the above, when a movable portion of the stage 6, in other words, the movable mirror 5 has to be tilted during the measurement of the position of the movable mirror 5 based on the reason that a pitching or rolling adjustment, e.g. is needed for a table on which the movable mirror 5 is mounted, the position of the reflected measurement beam LM is displaced due to the tilting of the movable mirror 5, as shown in FIG. 13. If an area of the interference region in the light-receiving portion of the receiver 7 is reduced due to this positional displacement, a signal intensity (S/N ratio) of the photoelectric conversion signal of the interference light is also reduced. When the signal intensity falls below a level of detection sensitivity of the photoelectric conversion element, it is not possible to accurately measure the movement.

Furthermore, regardless of the size of a diameter of the measurement beam LM, an amount of displacement of the measurement beam LM corresponding to the predetermined tilting angle of the movable mirror 5 is constant. Therefore, in order to reduce the occurrence of undesirable effects caused by the tilting of the movable mirror 5, it is better to enlarge diameters of the measurement beam LM and the reference beam LR. Consequently, in the prior art, the beam diameter of the laser beam L irradiated from the laser light source was enlarged, whereby the desired range (stroke of a tilting angle) over which the movable mirror 5 is allowed to tilt could be obtained.

FIG. 14 shows a stage of superposition of a circular reference beam LR and a circular measurement beam LM in the light-receiving portion of the receiver 7 (FIG. 13). If it is assumed that an intensity distribution of each beam is uniform in FIG. 14, a signal intensity obtained by a photoelectric conversion of the interference light is defined as I, said interference light being obtained from the complete superposition of the measurement beam LM and the reference beam LR. Assuming that a radius of each of the measurement beam LM and the reference beam LR is r, a signal intensity I(t) obtained when the reference beam LR and the measurement beam LM are displaced each other by the distance t is expressed by the following formula:

$$I(t) = 2(\theta - \sin\theta \cos\theta)/\pi$$

with $$\theta = \cos^{-1}(t/(2r)), \quad 0 \leq \theta \leq \pi/2$$

It is understood from this formula that, by enlarging the beam diameter (2r), the reduction of the signal intensity of the interference light can be suppressed on condition that the amount of displacement t is maintained constant. Even if an output of the laser light source 1 is maintained constant regardless of the beam diameter, a permissible amount of displacement of the measurement beam LM becomes larger as the beam radius r becomes larger, on condition that detection sensitivity of the receiver 7 of the laser interferometer is maintained constant.

While the laser interferometer as shown in FIG. 12 is an example of a single path type interferometer, it is difficult to actually use this single path typo interfarometer under the condition that the movable mirror 5 is tilted to a great extent, because, when the movable mirror 5 is tilted, inclination is caused between the wave plane of the measurement beam LM and the wave plane of the reference beam LR so that the S/N ratio of the interference signal drops drastically.

Therefore, a double path type interferometer is generally used, because inclination does not arise between the wave planes of both beams even when displacement occurs between the measurement beam and the reference beam as a result of tilting of movable mirror. In the double path type interferometer, the reference beam and the measurement beam travel reciprocally twice between the polarization beam splitter and the fixed mirror and between the polarization beam splitter and the movable mirror, respectively, order to perform reciprocal travel a second time, a corner-cube is used.

FIG. 15a shows a corner-cube 8 of diameter φ1 used in a double path type laser interferometer. In this FIG. 15a, the reference beam LR1 and the measurement beam LM1 which have already traveled reciprocally for the first time enter the corner-cube 8. The two beams are then reflected by the corner-cube 8 and directed to the polarization beam splitter as a reference beam LR2 and a measurement beam LM2 performing reciprocal travel the second time. The space between the beam performing reciprocal travel the first time and the beam performing reciprocal travel the second time is defined as W1.

PROBLEMS OF PRIOR ART

In the prior laser interferometer, undesirable effects caused by the displacement of the measurement beam through the tilting of the movable mirror can be reduced by enlarging the beam diameter of the laser beam. However, in a system in which the beam diameter is enlarged, the size of optical parts of the laser interferometer should also be enlarged.

When the optical parts are enlarged in such a way, however, the entire construction of the interferometer is also enlarged, which results in a difficulty in incorporating the interferometer into various stage devices.

Furthermore, in the double path system using a corner-cube 8 as shown in FIG. 15a, if the space W1 between two light beams is large, it is required to make the outer diameter of the corner-cube 8 larger. Therefore, in order to make the size of optical parts smaller, it is preferable to make the space W1 as small as possible. Further, in the double path system, if the beam diameter is made larger without changing the beam space W1 in order to reduce the occurrence of undesirable effects caused by the displacement of the measurement beam due to the tilting Of the movable mirror, as shown by the reference beams LR3 and LR4 in FIG. 15b, the beams LR3 and LR4 would strike the ridge lines (lines dividing the reflecting surface into three equal parts about a center of the optical axis) as well as contour lines of the corner-cube 8.

Even when the beams strike the ridge lines in such a way, an ideal corner-cube would be free from problems, but, in actuality, the ridge line has a certain width. Furthermore, there may exist an error of the degree of a right angle formed by two reflecting surfaces between which a ridge line in question exists. Therefore, there is a possibility of an adverse effect being exerted on a measurement operation as a result of turbulence occurring in a wave plane of the laser beam emitted from the corner-cube. Therefore, it is preferable to use a large corner-cube 9 having a diameter φ2, as shown in FIG. 15c, whereby it is also desirable to establish a beam space as W2, such that the reference beams LR3 and LR4 do not strike the ridge lines and contour lines.

In this case, however, the beam space W2 is unfortunately made larger which runs contrary to the desirable situation to reduce the size of optical parts as described above. Namely, in this case, it is required to use a corner-cube 9 having a large diameter, thereby enlarging the size of optical parts. Other disadvantages include an increase in costs and difficulty in mounting the interferometer into the stage devices etc.

SUMMARY OF THE INVENTION

It is an object of the present invention to provide an interferemetric distance measuring apparatus, so-called, an interferometer intended to establish the optical intensity distribution in a cross-section of a light beam along the optical path so as to be asymmetric such that a shape of the cross-section can be expanded in the predetermined direction (e.g., from a circular cross-sectional shape to an elliptic one), for making permissible amount of displacement between the reference beam and the measurement beam in said predetermined direction larger, without enlarging the size of optical parts of the interferometer, thereby enabling the size of said optical parts to be smaller.

It is another object of the present invention to provide an interferemetric distance measuring apparatus intended to establish the optical intensity distribution in a cross-section of a light beam so as to be asymmetric as above-mentioned when it is applied to a double path type interferometer with a corner-cube, for example, for making the beam space between each path of double paths smaller than that in the case of a circular (i.e., symmetric) cross-section, under the condition that the same amount of displacement occurs, thereby making the corner-cube smaller. In other words, said permissible amount of displacement mentioned above can be made larger than that in the prior art, under the condition that the size of the corner-cube is maintained constant.

An interferemetric distance measuring apparatus according to the present invention for achieving the above-mentioned objects, as shown in FIGS. 1–3, comprises a light source (11) for irradiating a main light beam (L), a beam splitting member (26) for splitting the main light beam into a first light beam (MR1, MR2) and a second light beam (MM1, MM2), respectively, a first reflection member (28) and a second reflection member (14) for reflecting the first light beam and the second light beam, respectively, an optical composition member (26) for compositing the first light beam reflected by the first reflection member (28) and the second light beam reflected by the second reflection member (14), and a photoelectric convertor (19) for receiving The composited light beam from the optical composition member, whereby a relative displacement between the first reflection member (28) and the second reflection member (14) is detected based on a photoelectric conversion signal from the photoelectric converter (19), said apparatus further comprising an asymmetric conversion member (12) for establishing the optical intensity distribution of a cross-section of at least one beam selected from a group of light beams including %he main light beam (L) irradiated from said light source (11), said first light beam (MR1, MR2) and said second light beam (MM1, MM2), said asymmetric conversion member being arranged at least one portion on an optical path of light beam between the light source (11) and the photoelectric converter (19), said optical intensity distribution being asymmetric relative to a center of said optical intensity distribution.

In this case, an example of the asymmetric conversion member is one or more anamorphic prisms (24, 25) arranged on an optical path between the light source (11) and the photoelectric converter (19). An anamorphic prism is defined as a prism wherein two deflection angles in two different directions on a cross-section of an entering light beam are different from each other.

Another example of the asymmetric conversion member is a pair of cylindrical lenses (51A, 51B) arranged on an optical path between the light source (11) and the photoelectric converter (19).

In addition, in the case that a main light beam (L) with a symmetric optical intensity distribution is irradiated from the light source (11), it is preferable that the asymmetric conversion member is arranged between the light source (11) and the beam splitting member However, as the light source, an asymmetric light source (40, 41) for irradiating said main light beam such that an optical intensity distribution thereof is asymmetric can be used, whereby the asymmetric light source also serves as an asymmetric conversion member.

Furthermore, an interferemetric distance measuring apparatus according to the present invention comprises a light source (11) for irradiating a main light beam (L), a beam splitting member (26) for splitting the main light beam into a first light beam (MR1, MR2) and a second light beam (MM1, MM2), a first reflection member (28) and a second reflection member (14) for reflecting the first light beam and the second light beam, respectively, an optical composition member (26) for compositing the first light beam reflected by the first reflection member (28) and the second light beam reflected by the second reflection member (14), and a photoelectric converter (19) for receiving the composited light beam from the optical composition member, whereby a relative displacement between the first reflection member (28) and the second reflection member (14) is detected based on a photoelectric conversion signal from the photoelectric conversion member (19), said apparatus further comprising an asymmetric conversion member (12) for establishing the optical intensity distribution of a cross-section of at least one beam selected from a group of light beams including the main light beam (L) irradiated from said light source (11), said first light beam (MR1, MR2) and said second light beam (MM1, MM2), said asymmetric conversion member being arranged at least one portion on at optical path of light beam between the light source (11) and the photoelectric converter (19), said optical distribution being asymmetric relative to a center of said optical intensity distribution, and a reflection member (29) for double path into which the first light beam and the second light beam reflected by said first reflection member (28) and said second reflection member (14) are entered and which reflects said entered first light beam and said second light beam in the same directions as those in which the beams are entered, such that said reflected beams are directed again via said first reflection member (28) and said second reflection member (14) into said optical composition member (26).

In this case, an example of the reflection member for double path is a corner-cube.

BRIEF DESCRIPTION OF THE DRAWINGS

FIG. 11b is a sectional view of the laser beam taken along the line C—C in FIG. 11a.

DESCRIPTION OF THE PRINCIPLE OF THE INVENTION

The principle of the present invention will be described with reference to FIG. 1. As a coordinate system, Y-axis is taken in parallel to the second light beam (MM1 etc.) entering the second reflection member (14) and an orthogonal coordinate system within the two dimensional plane perpendicular to the Y-axis is taken as X-axis and Z-axis. A movable mirror (14) fixed to the Y-stage (17Y) which is movable in the Y-direction is assumed as the second reflection member (14), which can detect an amount of movement of the Y-stage (17Y).

In this case, the direction of the displacement of the second light beam (MM1, etc.) when the movable mirror (14) is tilted is represented by a protection of a normal vector of a reflecting surface of the movable mirror onto another surface perpendicular to an optical axis of the second light beam (MM1, etc.). Further, an actual amount of displacement of the light beam is obtained by multiplying a proportional constant determined from a distance between the movable mirror (14) and the photoelectric converter (19) by an amount of displacement of the projection of its normal vector.

Figure 1:
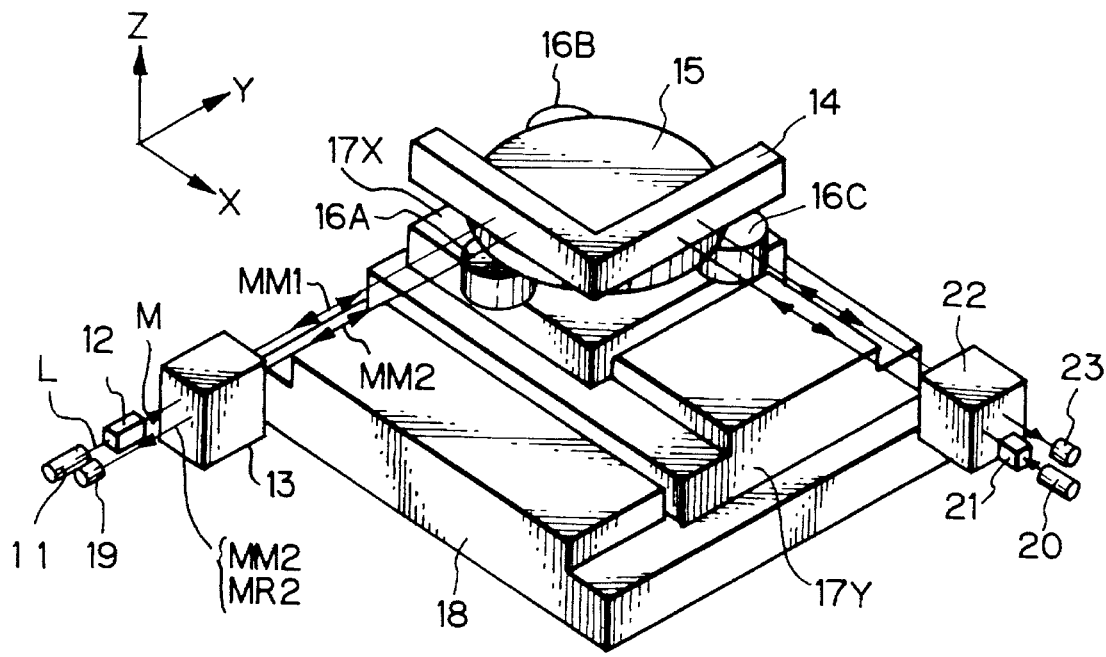
FIG. 1 is a perspective view showing a stage device of an interferemetric distance measuring apparatus according to the present invention in order to show a principle thereof as well as the first embodiment thereof.

In FIG. 1, for example, if it is assumed that the normal vector of the movable mirror (14) in the predetermined state is taken as (b, 1, a) in the (X, Y, Z) coordinate system, and the distance from the movable mirror (14) to the photoelectric converter (19) of the interference light is taken as T, the vector in the direction of displacement of the movable mirror (14) is obtained as (b, 0, a). Consequently, the vector showing an amount Of displacement of the light beam of the interference light at the position of the photoelectric converter (19) is obtained as 2T (b, 0, a).

Herein, if each amount of rotation of the movable mirror (14) about the X-axis, Y-axis and Z-axis, respectively, appears successively as a minute angle dθ, the normal vector is obtained as follows:

(b, cos dΘ−a sin dθ, sin dθ+a cos dθ), (a sin dθ+b cos dθ, 1, a cos dθ−b sin dθ), (sin dθ+b cos dθ, cos dθ−b sin dθ, a)

Further, if terms of two or more dimensions are abbreviated, they can be alternatively expressed as follows:

(b, 1−adθ, a+dθ), (b+adθ, 1, a−bdθ), (b+dθ, 1−bdθ, a)

Consequently, amounts of displacement of the light beam at the photoelectric converter (19) are obtained as follows, where it is under a single path system:

2T (0, 0, dθ), 2T (adθ, 0, −bdθ), 2T (dθ, 0, 0)

Further, an amount of displacement of the second light beam (MM1, etc.) which appears or is caused when the movable mirror (14) is tilted in any direction can be obtained as a sum of these vectors.

The movable mirror (14) is in principle perpendicular to the entering second light beam (measurement beam) (MM1). Therefore, if the tilting angle of the movable mirror is minute, the condition of a <<1 and b <<1 can be assumed. Therefore, an amount of displacement of the light beam caused by the rotation of the movable mirror (14) about the Y-axis (in parallel to the second light beam (MM1, etc.)) is extremely small compared to an amount of displacement caused by the rotation of the mirror (14) about axes (X-axis, Z-axis) perpendicular to the second light beam (MM1, etc.).

In the interferometer, as shown in FIG. 1, if a pitching or rolling adjustment, e.g., is performed for the table (15) on which the movable mirror (14) is mounted, the movable mirror (14) can possibly be rotated about the X-axis or Y-axis, but not about the Z-axis. On the other hand, if a yawing adjustment is performed, only the rotation of the mirror (14) about the Z-axis is generated.

Relating to this, the present invention concerns with the case that only either one of pitching or rolling adjustment or yawing adjustment is performed for the table (15) to which the movable mirror (14) is fixed. If only a pitching or rolling adjustment is performed, for example, the movable mirror (14) rotates only about the X-axis or Y-axis, so that it results in that the second light beam (MM1, etc.) is largely displaced only in the Z-axis. On the contrary, if only a yawing adjustment is performed, the movable mirror (14) is rotated only about the z-axis, with the result that the second light beam (MM1, etc.) is largely displaced only in the X-direction.

Figure 7:
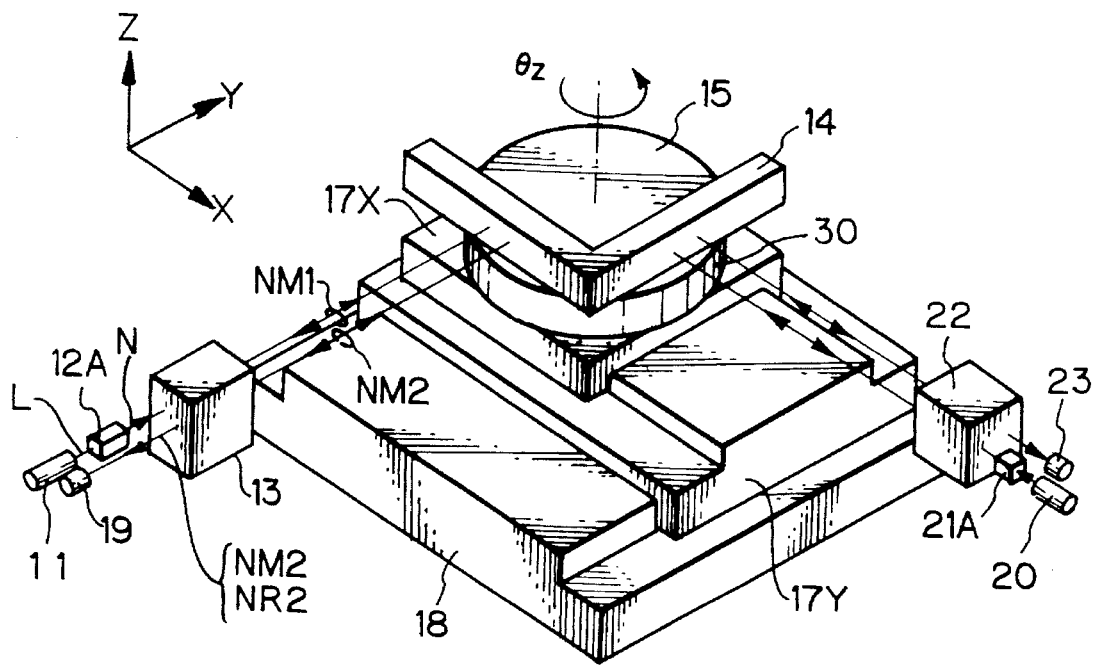
FIG. 7 is 8 perspective view showing a stage device of the second embodiment of the interferometer according to the present invention.

In the present invention, therefore, if the second light beam (measurement beam) (MM1, etc.) is displaced only in the Z-axis, a cross-sectional shape of the light beam (L) from the light source (11) is expanded in the Z-direction like a light beam (M), as shown in FIG. 2, which has an asymmetric shape. Therefore, undesirable effects caused by the displacement of the movable mirror can be reduced to a greater extent than in the prior arts even when the second light beam is displaced in the Z-direction by the same amount as that in the prior arts. On the other hand, if the second light beam (MM1, etc.) is largely displaced only in the X-axis, the light beam (L) from the light source (11) is expanded in the X-direction, as shown in FIG. 7, which has an asymmetric shape. Therefore, the undesirable effects caused by the displacement of the movable mirror can be reduced to a greater extent than in the prior arts even when the second light beam is displaced in the X-direction by the same amount as that in the prior art.

Furthermore, if anamorphic prisms (24, 25) are used as an asymmetric converters as shown in FIG. 2, it is possible to expand a circular cross-sectional shape of the light beam (L) from the light source (11) in the predetermined direction (Z-direction), into an asymmetric cross-sectional shape of the light beam (L), without aberration.

Furthermore, if a pair of cylindrical lenses are used as asymmetric conversion members, It is possible to expand or contract the cross-sectional shape of the light beam (L) from the light source (11) in the predetermined direction on the same optical axis as that at the time of incidence of the beam.

Furthermore, if the asymmetric conversion member is arranged between the light source (11) and the beam splitting member (26), the optical intensity distribution in the cross-section of each of the first and the second light beams, etc. is made asymmetric after the conversion member.

Furthermore, if an asymmetric light source (40, 41) like a laser diode, e.g., is used, which generates a main light beam having asymmetric optical intensity distribution, the source (40, 41) also serves as an asymmetric conversion member so that the optical intensity distribution in the cross-section of light beam on all the optical paths from the asymmetric light source to the photoelectric converter (19) is made asymmetric.

DESCRIPTION OF THE PREFERRED EMBODIMENT

The first embodiment of an interferemetric distance measuring apparatus, so-called an interferometer according to the present invention will be described with reference to FIGS. 1–4b in the following. This embodiment is a double path type laser interferometer for coordinate measurement, which is mounted On the stage device provided with a leveling mechanism (tilting mechanism).

FIG. 1 shows a stage device provided with a laser interferometer according to-the present invention. In FIG. 1, a laser beam L with a circular cross-sectional shape irradiated from a laser light source 11 such as a He—Ne laser light source passes through an asymmetric beam expander 12 whereby a cross-sectional shape of the beam L is changed into an ellipse, a longer axis of which is in the direction parallel to the Z-axis. The beam L then enters an interference measuring portion 13 for Y-axis as a laser beam M. A measurement beam MMI (P-polarized light) emitted from the interference measuring portion 13 enters an L-shaped movable mirror 14 in the direction parallel to the Y-axis perpendicular to the Z-axis. The X-axis is taken perpendicularly to a plane formed by the Z-axis and the Y-axis.

The movable mirror 14 is provided with a reflecting surface substantially perpendicular to the Y-axis and another reflecting surface substantially perpendicular to the X-axis, wherein the measurement beam MM1 enters the reflecting surface substantially perpendicular to the Y-axis. The measurement beam MM1 reflected by the movable mirror 14 returns to the interference measuring portion 13. The beam is then and further reflected by the interference measuring portion 13 and enters the movable mirror 14 as a measurement beam MM2 in the direction substantially parallel to the Y-axis. Then, the measurement beam MM2 reflected by the movable mirror 14 returns to the interference measuring portion 13. This measurement beam MM2 enters, together with a reference beam MR2 (S-polarized light) Generated in the portion 13, a receiver 19 comprising an analyzer and a photoelectric conversion element, as an interference light in the direction substantially parallel to the Y-axis.

The movable mirror 14 is fixed onto a mount table 15 for mounting a wafer etc. This mount table 15, on the other hand, is mounted on an X-stage 17X via a leveling mechanism (tilting mechanism) consisting of three supporting points 16A–16C which are expandable in the Z-direction, respectively. The X-stage 17X is mounted on a Y-stage 17Y so as to be movable along the X-axis. The Y-stage 17Y, on the other hand, is mounted on a base 18 so as to be movable along the Y-axis. An amount of movement of the mount table 15 in the Y-direction can be measured by the laser light source 11, the beam expander 12, the interference measuring portion 13, the movable mirror 14 and the receiver 19.

In a similar way, a laser beam from a laser light source 20 for X-axis is expanded in the Z-direction by the beam expander 21, and enters an interference measuring portion 22 for X-axis. The measurement beam emitted from the interference measuring portion 22 is directed to a reflecting surface of the movable mirror 14 substantially perpendicular to the X-axis, and the measurement beam reflected by this reflecting surface returns to the interference measuring portion 22. Then, the measurement beam reflected by the interference measuring portion 22 is directed again to the movable mirror 14.

The measurement beam reflected again by the movable mirror 14 is composited with a reference beam inside the interference measuring portion 22 and enters a receiver 23. An amount of movement of the mount table 15 in the X-direction can be measured by the laser light source 20, the beam expander 21, the interference measuring portion 22, the movable mirror 14 and the receiver 23.

Figures 2A, 2B, 2C:
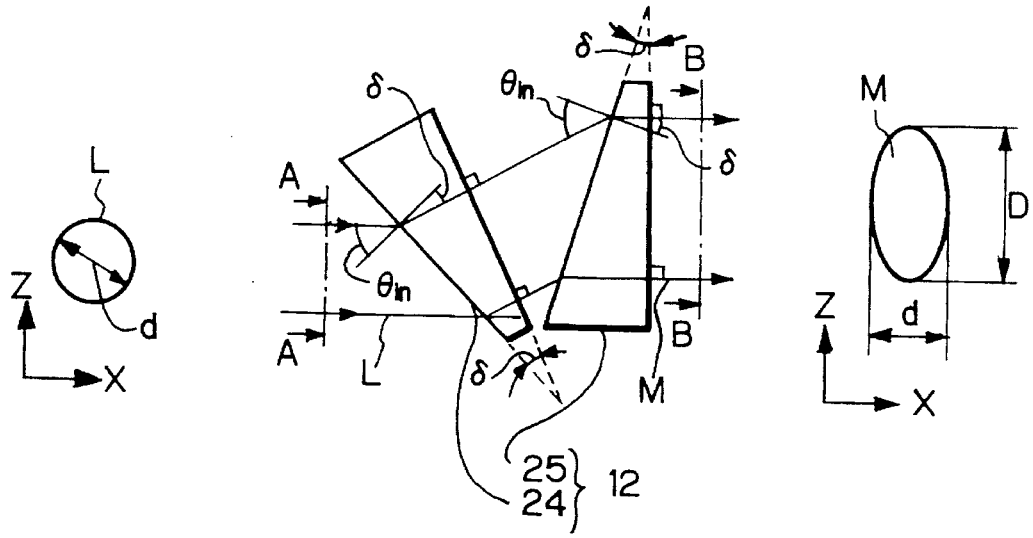
FIG. 2a is a sectional view taken along the line A—A of FIG. 2b.
FIG. 2b is a view showing an example of a construction of the beam expander shown in FIG. 1.
FIG. 2c is a sectional view taken along the line B—B in FIG. 2b.

FIG. 2b shows an example of a construction of the asymmetric beam expander 12 shown in FIG. 1. In FIG. 2b the cross-sectional shape of the laser beam L irradiated from the laser light source 11 in FIG. 1 is a circular shape with the diameter d as shown in FIG. 2a, The laser beam L then enters a first anamorphic prism 24 with an incident angle $\theta_{in}$, said prism 24 having a refractive index n and a vertical angle 6. The incident angle $\theta_{in}$ is selected such that the laser beam emitted from the prism 24 is made perpendicular to a surface of the prism That is, the following relation is obtained:

$$\sin \theta_{sin} = n \cdot \sin \delta$$

The laser beam emitted from the first anamorphic prism 24 enters a second anamorphic prism 25 with an incident angle $\theta_{in}$, said prism 25 having a refractive index n and a vertical angle δ. From this prism 25, a laser beam M is emitted perpendicularly to a surface of the prism 25. In this case, the width D of the emitted laser beam M in the Z-direction is expressed by using the width d of the entering laser beam L in the Z-direction:

$$(D/\cos \delta) \cos \theta_{in} = (d/\cos \theta_{in}) \cos \delta$$

Therefore, the following formula is obtained:

$$D = (\cos \delta / \cos \theta_{in})^2 \cdot d$$

In this embodiment, it is assumed that the condition is $\delta < \theta_{in}$ and D>d. For example, it is assumed that the width D is equal to 2d. That is, the laser beam M having an elliptic cross-sectional shape with the width D in the Z-direction is first obtained, as shown in FIG. 2c, by expanding the cross-sectional shape of the entering laser beam L in the Z-direction by the beam expander 12, and this laser beam M enters the interference measuring portion 13 shown in FIG. 1. In case that a pair of anamorphic prisms 24, 25 are used, it is possible to obtain good asymmetric cross-sectional shape of the beam, without a distortion of waveform in the laser beam.

In this embodiment, while the incident angle $\theta_{in}$ is selected such that an exit angle of the laser beam emitted from the anamorphic prism 24 is made 90°, the exit angle can take any angles other than 90°. While a laser beam M with the length D in the Z-direction as well as the length d in the X-direction is obtained by expanding in the Z-direction the laser beam L with the diameter d, it is alternatively possible to generate a laser beam with the diameter D from the laser light source 11 and then to contract the laser beam in the X-direction by the beam expander 12, thereby obtaining a laser beam M with the length D in the Z-direction and the length d in the X-direction.

Figure 3:
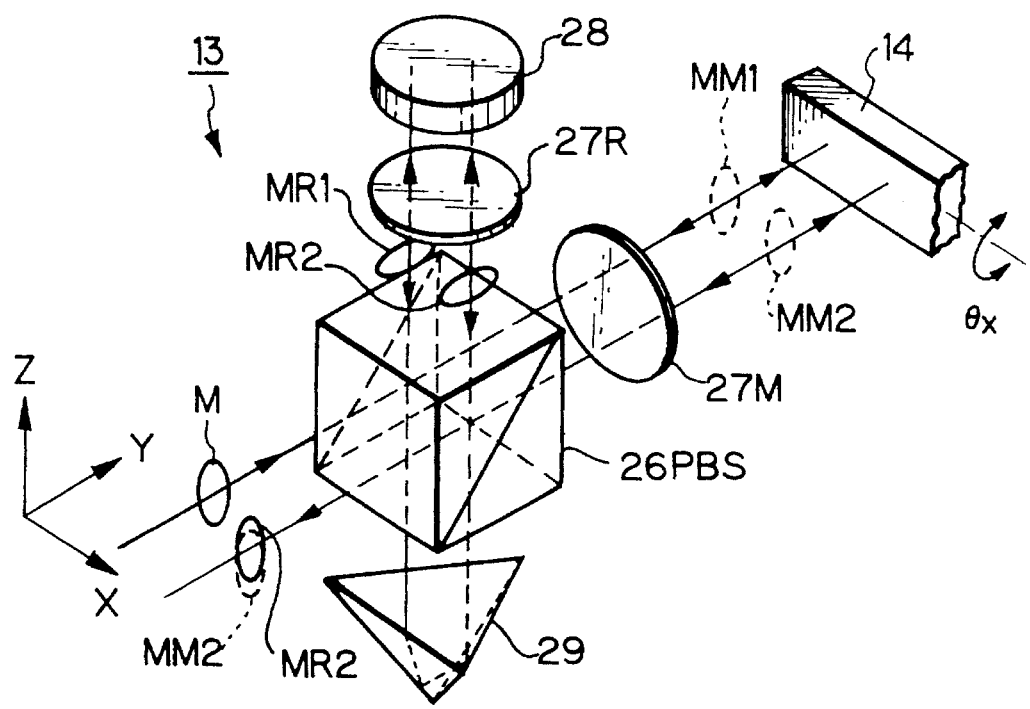
FIG. 3 is a perspective view showing an interference measuring portion 13 in FIG. 1.

FIG. 3 shows a construction of the interference measuring portion 13 of double path system shown in FIG. 1. In FIG. 3, within the laser beam M with an elliptic cross-sectional shape entering the portion 13, two polarized light components which are orthogonal to each other are included. S-polarized light component polarized in the direction perpendicular to an incident surface is reflected by a polarized beam splitter (PBS) 26 and directed as a reference beam MR1 to a fixed mirror 28 through a ¼-wave plate 27R. The reference beam MR1 reflected by the limed mirror 28 passes through the ¼-wave plate 27R and is transmitted as P-polarized light through the polarized beam splitter 26, and is further directed to a corner-cube 29 as P-polarized light. The reference beam MR1, after reflected by the corner-cube 29 as a reference beam MR2 and transmitted through the polarized beam splitter 26, and enters, through the l/4-wave plate 27, the fixed mirror 28. The reference beam MR2 reflected again by the fixed mirror 28 passes through the ¼-wave plate 27R, is reflected by the polarized beam splitter 26, and then enters, as S-polarized light, the receiver 19 shown in FIG. 1 in the direction substantially parallel to the Y-axis.

On the other hand, P-polarized light component polarized in the direction parallel to the incident surface of the polarized beam splitter 26 is transmitted through the polarized beam splitter 26 and directed as a measurement beam MM1 through the ¼-wave plate 27M to the movable mirror 14. The measurement beam MM1 reflected by the movable mirror 14 passes through the ¼-wave plate 27M and is reflected by the polarized beam splitter 26 and is directed to the corner-cube 29 as S-polarized light. The measurement beam MM1 reflected by the corner-cube 29 returns as a measurement beam MM2 to the polarized beam splitter 26.

The measurement beam MM2 reflected by the polarized beam splitter 26 is directed through the ¼-wave plate 27M to the movable mirror 14, and the measurement beam MM2 reflected by the movable mirror 14 passes through the ¼-wave plate 27M. This measurement beam MM2 is further transmitted as a P-polarized light through the polarized beam splitter 26 and enters, as P-polarized light, the receiver is shown in FIG. 1 in the direction substantially parallel to the reference beam MR2.

In the receiver 19 in FIG. 1, a photoelectric conversion signal of the interference light composited by the reference light MR2 and the measurement light MM2 is generated. Based on this photoelectric conversion signal, an amount of movement of the movable mirror 14 in the Y-direction can be measured. In the case that the predetermined frequency difference is given previously between the reference beam MR1 and the measurement beam MM1, a measuring operation using the heterodyne interference method is performed, and in the case that their beam frequencies are equal, on the other hand, a measuring operation using the homodyne interference method is performed. Furthermore, in the present embodiment of double path system, the measurement beam travels reciprocally twice as MM1 and MM2 between the polarized beam splitter 26 and the movable mirror 14, thereby the resolving power of measurement being improved to ½, as compared to the embodiment of single path system.

In FIG. 3, the cross-sectional shape of the reference beam MR1, MR2 entering the fixed mirror 28 is an elliptic shape, a longer axis of which is in the Y-direction, and the cross-sectional shape of The measurement beam MM1, MM2 entering the movable mirror 14 is an elliptic shape, a longer axis of which is in the Z-direction.

Figure 4A:
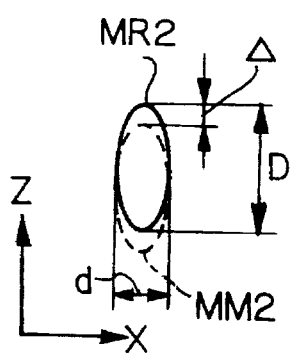
FIG. 4a is a view showing the state of a superposition of each beam at an incident surface of a receiver 19 shown in FIG. 1.
Figure 4B:
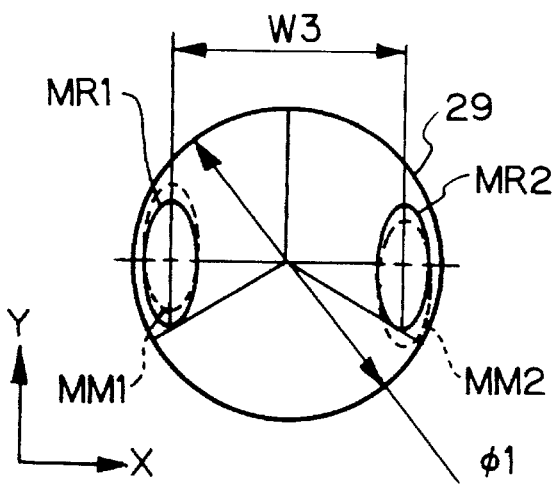
FIG. 4b is a plan view of a corner-cube 29 shown in FIG. 3.

FIG. 4b is a plan view of the corner-cube 29 shown in FIG. 3 with the diameter $\phi 1$. The reference beam MR1 and the measurement beam MM1 with an elliptic cross-sectional shape, longer axis of which are in the Y-direction, respectively, enter the corner-cube 29, and the reference beam MR2 and the measurement beam MM2 with an elliptic cross-sectional shape, longer axes of which are in the Y-direction in the same way, respectively, are emitted therefrom. The beam space between the reference beam MR1 and the measurement beam MR2 is W3, for example.

Operation of the present embodiment will be described. In an interference optical system as shown in FIG. 3, when the movable mirror 14 is tilted about axes perpendicular to the measurement beam MM1, MM2, i.e., X-axis or Y-axis by the predetermined angle θ, each of the measurement beam MM1, MM2 is displaced in the direction parallel to the Z-direction or X-direction, respectively. This amount of displacement is approximately equal to 4Tθ if the distance from a reflecting surface of the movable mirror 14 to an apex of the corner-cube 29 is taken as T.

Relating to this, the mount table 15 according to the present embodiment is mounted on the X-stage 17X via a leveling mechanism 16A–16C, as shown in FIG. 1, so that, in FIG. 3, it is enough to take into consideration only the rotational angle $\theta_x$ about an axis parallel to the X-axis in various rotational angles of the movable mirror 14. Compared with this, another rotational angle about the Z-axis is substantially negligible, and there is little effect caused by the rotation about the Y-axis. That is to say, when the measurement beams MM1 and MM2 are reflected by the movable mirror 4, the direction of displacement of the beam due to the tilting of the movable mirror 14 is mainly in the Z-direction and that an amount of displacement of the beam in the other directions is negligible.

FIG. 4a shows the state of superposition of the reference beam MR2 and the measurement beam MM2 at a light-receiving surface of the receiver is shown in FIG. 1. As shown in FIG. 4a, in the present embodiment, the measurement beam MM2 is displaced in the Z-direction by the distance Δ relative to the reference beam MR2 due to the tilting of the movable mirror 14. However, both the reference beam MR2 and the measurement beam MM2 have an elliptic cross-sectional shape, respectively, in which the length D in the Z-direction is longer than the length d in the X-direction, so that undesirable effects caused by an amount of displacement Δ in the Z-direction are suppressed as compared to the prior art.

Similarly, in the laser interferometer for X-axis shown in FIG. 1 including the interference measuring portion 22, the cross-sectional shape of the laser beam irradiated from the laser light source 20 is expanded in the Z-direction. Furthermore, it is enough with regard to the reflecting surface of the movable mirror 14 substantially perpendicular to the X-axis to take into consideration only the rotational angle about the axis parallel to the Y-axis, so that the direction of the displacement of the measurement beam reflected by the movable mirror 14 is mainly in the Z-direction. Therefore, in this laser interferometer for the X-axis as well, undesirable effects caused by the tilting of the movable mirror 14 are suppressed or reduced by expanding the cross-sectional shape of the laser beam in the Z-direction.

Now, the corner-cube 29 in FIG. 3 will be described in detail. While the corner-cube in FIG. 2 is shown as a pyramid type for convenience of explanation, it comprises actually a circular outline portion and a pyramid portion at the backside thereof, as shown in FIG. 4b. In the corner-cube 29 of the present embodiment, as shown in FIG. 4b, the reference beam MR1 and the measurement beam MM1, etc. are aligned such that their longitudinal directions (i.e. longer axes) are directed in the direction parallel to one ridge line (a connection line between two reflecting surfaces adjoining perpendicularly to each other) which is parallel to the Y-direction. Furthermore, the reference beam MR1 and the measurement beam MM1 etc., do not strike the other ridge lines. In order to prevent each beam from striking the other ridge lines of the corner-cube 29 as shown in FIG. 4b, it is required for the beam space W3 to satisfy the condition of the following formula:

$$W3 \geq (3D^2 + d^2)^{1/2}$$

If it is assumed that for each beam, in FIG. 4a, the width d in the X-direction is 4 mm and the width D in the Z-direction is 8 mm, it is required in FIG. 4b, from the above formula, that the space W3 for the double path should be 14.5 mm or more and that an effective diameter $\phi 1$ of the corner-cube 29 should be 18.5 mm or more.

Figure 15A:
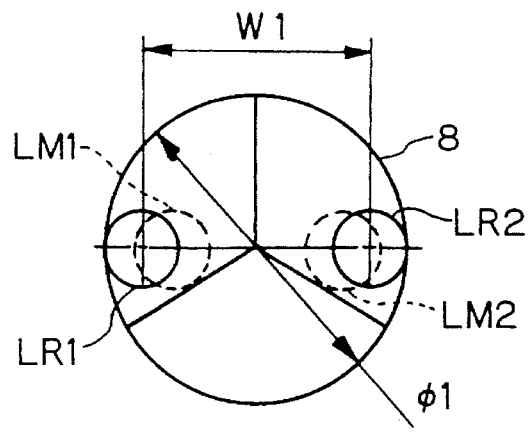
FIGS. 15a–15c are views showing corner-cubes used in the interferometer of a prior double path system.
Figure 15B:
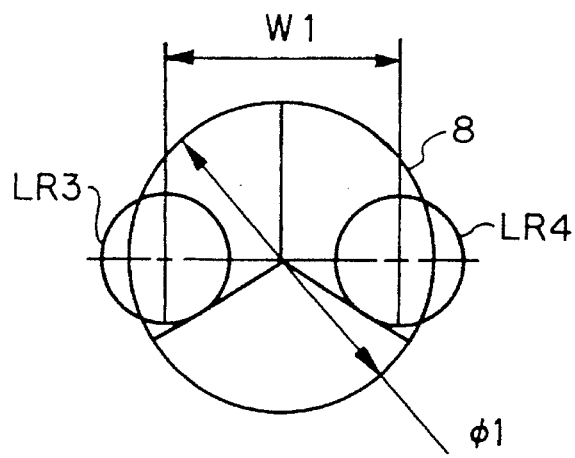
Figure 15C:
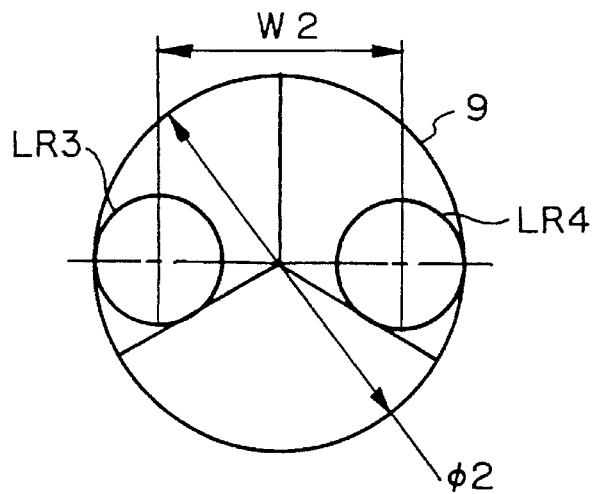

On the other hand, if a reference beam and a measurement beam of the same power with a circular cross-sectional shape are used, it is required that a beam diameter should be 8 mm in order to obtain the same rate of superposed area as the above when the same amount of displacement as the above occurs. In addition, as shown in the prior apt in FIG. 15c, it is required to take 16 mm or more for the space W2 for the double path and to take 54 mm or more for the effective diameter $\phi 2$ of the corner-cube 9. It is also understood that the other optical parts may possibly be larger in the prior art. Therefore, it is understood that, according To the present embodiment, the size of the optical parts can be made smaller.

While, in the above embodiment, the laser beam converted so as to have an elliptic cross-sectional shape by the beam expander 12 enters the receiver 19, the receiver 19 should have a light receiving area capable of receiving a whole of the elliptic cross-section laser beam, which may make the size of the receiver is slightly larger. Therefore, in order to avoid this, i.e., to make the receiver 19 smaller, the cross-sectional shape of the laser beam can be restored to the circular cross-sectional shape before entering the receiver 19. In this case where the elliptic section measurement beam and the elliptic section reference beam displaced to each other are converted again into a laser beam with a circular cross-sectional shape will be described with reference to FIGS. 5a and 5b.

Figure 5A:
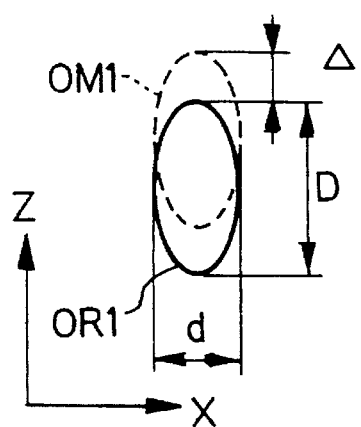
FIGS. 5a and 5b are views showing how a laser beam with an elliptic cross-sectional shape is restored to a laser beam with a circular cross-sectional shape.
Figure 5B:
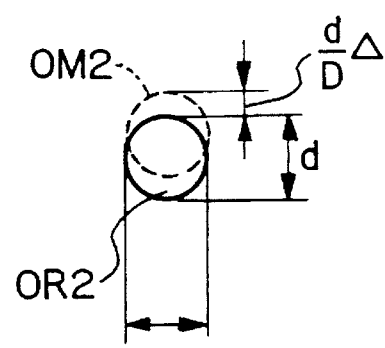

FIG. 5a shows a reference beam OR1 and a measurement beam OM1 displaced to each other by the distance Δ in the Z-direction. In FIG. 5a, the reference beam OR1 and the measurement beam OM1 have an elliptic cross-sectional shape with the length d in the X-direction and the length D in the Y-direction, respectively. When these two laser beams enter the anamorphic prisms 24, 25 shown in FIG. 2b in the reverse direction, i.e., from the exit side of FIG. 2b, a reference beam OR2 and a measurement beam OM2, each with a circular cross-sectional shape of the diameter d, can be obtained, as shown in FIG. 5b. An amount of displacement between the reference beam OR2 end the measurement beam OM2 in the Z-direction is also changed into dΔ/D through the reduction rate of d/D which is the same as that of the laser beam diameter. In addition, there is no reduction of the interference signal intensity. Therefore, it is possible to use a receiver with a smaller effective diameter corresponding to the diameter d of the laser beam in place of the receiver 19 in FIG. 1. Furthermore, in an interferometer in which the beam entering the interference measuring portion 13 and the beam emitted from the same are directed in parallel and in reverse direction to each other, as shown in FIGS. 1 and 3, it is possible without the addition of a new optical system to make an elliptic section laser beam to be restored to a circular section laser beam by arranging a beam expander 12 at the position where both beams pass.

In a similar way, in place of the beam expander 12 positioned before the interference measuring portion 13 in FIG. 1, a beam reforming optical system comprising anamorphic prisms or cylindrical lenses, etc. can be arranged between the interference measuring portion 13 and the movable mirror 14, e.g., between the ¼-wave plate 27M and the movable mirror 14. In this case, the cross-sectional shape of the laser beam is elliptic between the beam reforming optical system and the movable mirror 14. Therefore, if it is assumed that the magnification in the direction of a longer axis of the ellipse established by this beam reforming optical system is α, an amount of displacement of the laser beam caused by the movable mirror 14 is reduced into 1/α, when the elliptic section beam is restored to the circular section beam after a reciprocal travel through the beam reforming optical system. Therefore, in this case as well, undesirable effects caused by the rotation of the movable mirror 14 about the X-axis, which may occur between the beam reforming optical system and the movable mirror 14, can be reduced in the way similar to the above-mentioned embodiment.

In the above-mentioned embodiment, asymmetric beam expanders 12, 21 are used in order to obtain a laser beam with an asymmetric optical intensity distribution in its cross-section. In place of this, however, a laser light source in which the optical intensity distribution of the radiated laser beam is asymmetric can be used.

Figure 6:
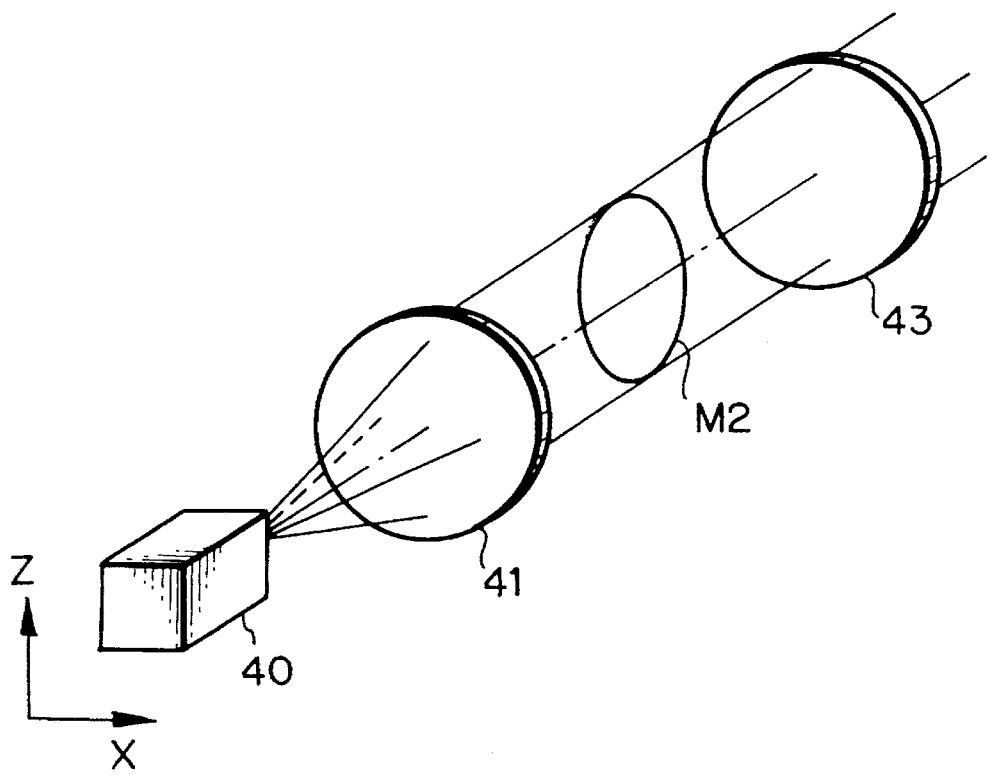
FIG. 6 is a perspective view showing a light source system for generating a laser beam with an elliptic cross-sectional shape by using a laser diode.

FIG. 6 shows an embodiment of such an asymmetric laser light source. In FIG. 6, a laser beam of linearly polarized light is irradiated from a laser diode 40 on condition that a divergent angle of the beam is greater in the Z-direction than that in the X-direction. Then, a laser beam M2 with an elliptic cross-sectional shape, a longer axis of which is in the Z-direction, is obtained by converting the laser beam irradiated from the laser diode 40 into a parallel luminous flux by using the collimator lens 41. Meanwhile, the laser beam M2 is the linearly polarized light polarized in a shorter axis direction (X-direction), so that the linearly polarized light of the laser beam M2 is further converted into circularly polarized light when it passes through the ¼-wave plate 43. Thereafter, when this laser beam M2 enters the polarized beam splitter 26 in FIG. 3, e.g., an interferometer of the homodyne interference method is achieved. In this case, a laser beam with an elliptic cross-sectional shape can be obtained without the need of another asymmetric beam expander, thereby enabling the interferometer to be made smaller.

Figure 8A:
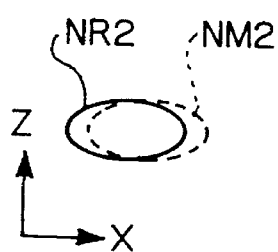
FIG. 8a is a view showing the state of a superposition of each beam at an incident surface of a receiver 19 shown in FIG. 7.
Figure 8B:
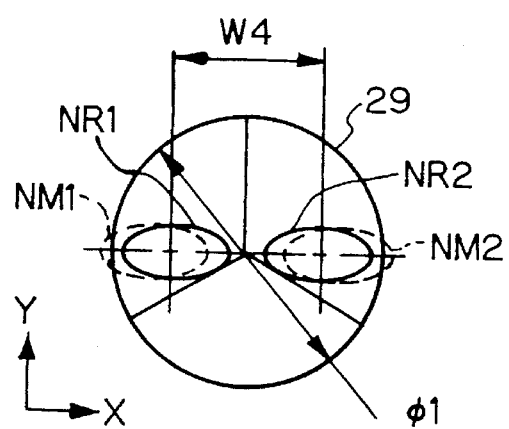
FIG. 8b is a plan view of a corner-cube 29 in the interference measuring portion 13 shown in FIG. 7.

Now, the second embodiment of the present invention will be described with reference to FIGS. 7, 8a and 8b. In FIGS. 7, 8a and 8b, parts corresponding to FIGS. 1–3 are given the same reference numerals.

FIG. 7 shows a stage device of a laser interferometer according to the second embodiment. In FIG. 7, a laser beam L with a circular cross-sectional share irradiated from a laser light source 11 passes through an asymmetric beam expander 12A as a laser beam N with an elliptic cross-sectional shape, a longer axis of which is in the X-direction, and thereafter enters an interference measuring portion 13 for Y-axis. A measurement beam NM1 emitted from the interference measuring portion 13 enters in parallel to the Y-axis, an L-shaped movable mirror 14. The measurement beam NM1 reflected by the movable mirror 14 returns to the interference measuring portion 13. The measurement beam NM2 further reflected by the interference measuring portion 13 enters, substantially in parallel to the Y-axis, the movable mirror 14. Then, the measurement beam NM2 reflected by the movable mirror 14 returns again to the interference measuring portion 13. This measurement beam NM2 enters, together with a reference beam NR2 generated in the portion 13, a receiver 19, as an interference light in the direction substantially parallel to the Y-axis.

The movable mirror 14 is fixed onto a mount table 15. The mount table 15 is mounted on an x-stage 17X via a rotary table 30 rotatable about an axis parallel to the Z-axis. Furthermore, a laser beam from a laser light source 20 for X-axis is expanded in the Y-direction by the beam expander 21A, and enters an interference measuring portion 22 for x-axis. The measurement beam emitted from the interference measuring portion 22 is directed to a reflecting surface of the movable mirror 14 substantially perpendicular to the X-axis, and the measurement beam reflected by this reflecting surface returns to the interference measuring portion 22. Then, the measurement beam reflected by the interference measuring portion 22 is directed again to the movable mirror 14.

The measurement beam reflected again by the movable mirror 14 is composited with a reference beam inside the interference measuring portion 22, and enters a receiver 23. The other constructions are the same as those in FIG. 1.

In the above second embodiment, it is enough to take into consideration only the rotational angle $\theta_z$ about an axis parallel to the Z-axis in various rotational angles of the movable mirror 14, so that the other rotational angles are negligible. That is, it can be assumed that the measurement beams NM1 and NM2 emitted from the interference measuring portion 13 and entering the movable mirror 14 are displaced only in the X-direction by the rotation of the movable mirror 14. In a similar way, it can be assumed that the measurement beam emitted from the interference measuring portion 22 and entering the movable mirror 14 is displaced only in the Y-direction by the rotation of the movable mirror 14.

FIG. 8a shows the state of superposition of the reference beam NR2 and the measurement beam NM2 on a light-receiving plane of the receiver 19 in FIG. 1. As shown in FIG. 8a, in the present embodiment, the measurement beam NM2 is displaced in the X-direction relative to the reference beam NR2 due to the tilting of the movable mirror 14. However, both the reference beam NR2 and the measurement beam NM2 have an elliptic cross-sectional shape, respectively, an axis in the X-direction is longer than that in the Z-direction, so that undesirable effects caused by the displacement in the X-direction is suppressed as compared to the prior art.

In the same way, in the laser interferometer for the X-axis in FIG. 7 including the interference measuring portion 22, the cross-sectional shape of the laser beam irradiated from the laser light source 20 is expanded in the Y-direction. Furthermore, it is enough for a reflecting surface of the movable mirror 14 substantially perpendicular to the X-axis to take into consideration only the rotational angle about the axis parallel to the Z-axis, so that the direction of the displacement of the measurement beam reflected by the movable mirror 14 is mainly in the Y-direction. Therefore, in this laser interferometer for the X-axis as well, undesirable effects caused by the tilting of the movable mirror 14 can be reduced by expanding the cross-sectional shape of the laser beam in the Y-direction.

Now, the corner-cube 29 in the interference measuring portion 13 in FIG. 7 will be described in detail. In the corner-cube 29 of the second embodiment, as shown in FIG. 8b, the reference beam NR1 and the measurement beam NM1 in the first path and the reference beam NR2 and the measurement beam NM2 in the second path are aligned such that their longitudinal directions (i.e. longer axes) are directed in the direction perpendicularly to one ridge line (a connection line between two reflecting surfaces adjoining perpendicularly to each other) which is parallel to the Y-direction. Furthermore, the reference beam NR1 and the measurement beam NM1, etc. do not strike the other ridge lines.

If it is assumed that for each beam NR2, NM2, in FIG. 8a, the width in the Z-direction is 4 mm and the width in the X-direction is 8 mm, it is required in FIG. 8b, that the space W4 for the double path should be 10.6 mm or more and that an effective diameter φ1 of the corner-cube 29 should be 18.6 mm or more.

On the other hand, if a reference beam and a measurement beam of the same power with a circular cross-sectional shape are used, it is required that a beam diameter should be 8 mm in order to obtain the same rate of superposed area as the above when the same amount of displacement as the above occurs. In addition, as shown in the prior art in FIG. 15c, it is required to take 16 mm or more for the space W2 for the double path and to take 24 mm or more for the effective diameter φ2 of the corner-cube 9. It is also understood that the other optical parts may possibly be larger in the prior art. Therefore, it is understood that, according to the present embodiment, the optical parts can be made smaller.

Now, the third embodiment of the present invention will be described with reference to FIGS. 9a, 9b and 10a–10e.

Figure 9A:
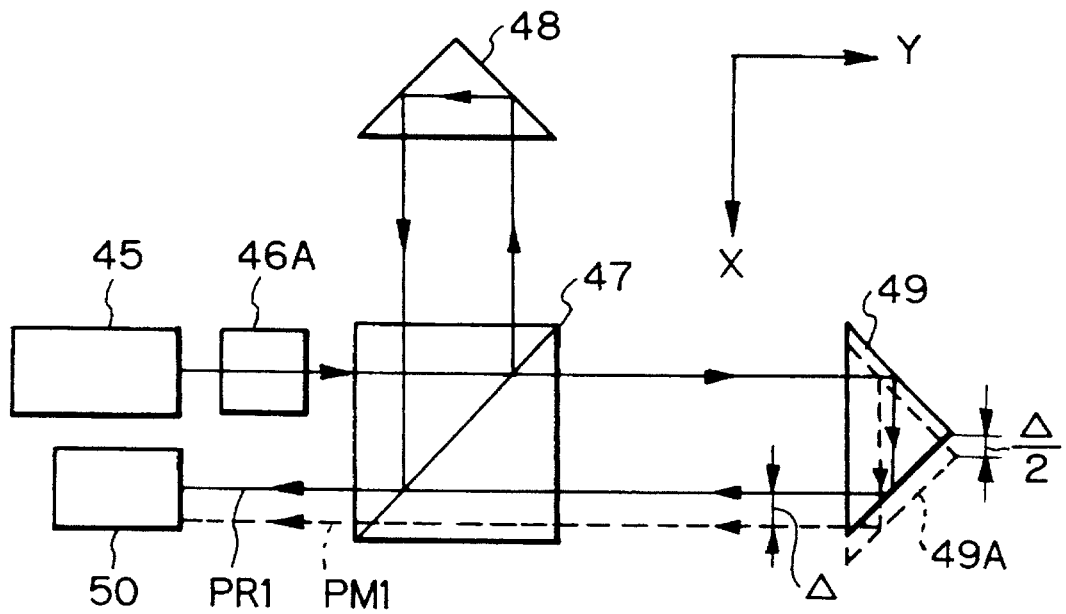
FIG. 9a is a view showing a basic construction of the third embodiment of the interferometer according to the present invention.

FIG. 9a shows a laser interferometer of the third embodiment. In FIG. 9a, a laser beam with a circular cross-sectional shape of the diameter d irradiated from a laser source 45 is reformed by a beam reforming unit 46A into a laser beam with an elliptic cross-sectional shape having the width D in the X-direction and the width d (d<D) in the Z-direction (the direction Z is perpendicular to a sheet surface in FIG. 9a). The laser beam emitted from the beam reforming unit 46A is divided into a reference beam and a measurement beam by a beam splitter 47. The reference beam reflected by the beam splitter 47 is made to return along the optical path by a corner-cube 48, and is reflected again by the beam splitter 47. This beam finally enters a receiver 50 as a reference beam PR1.

Figure 10A:
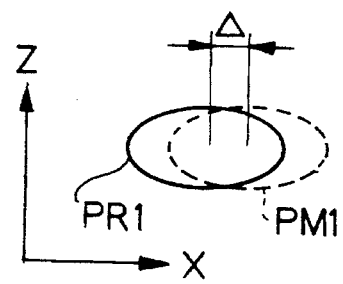
FIGS. 10a–10f are views showing the state of a superposition of each beam at an incident surface of a receiver 50 in the third embodiment and various modifications thereof.

On the other hand, the measurement beam transmitted through the beam splitter 47 is made to return along the optical path by the corner-cube 49, is transmitted again through the beam splitter 47. This beam finally enters the receiver 50 as a measurement beam PM1. At that time, the measurement beam PM1 is displaced in the X-direction by the distance which is twice of an amount of displacement of the apex of the corner-cube 49 in the X-direction. That is, when the corner-cube 49 is displaced by the distance Δ/2 in the X-direction into the position 49A, the measurement beam PM1 is displaced by the distance Δ on the receiver 50. It is possible to detect an amount of the displacement of the corner-cube 49 in the Y-direction by photoelectrically converting the interference light of the reference beam PR1 and the measurement beam PM1 at the receiver 50. At that time, the reference beam PR1 and the measurement beam PM1 are displaced each other by the distance Δ in the X-direction, as shown in FIG. 10a. On the other hand, in the case that there is no beam reforming unit 46A in FIG. 9a, the reference beam PR1 and the measurement beam PM1 detected at the receiver 50 are shown In FIG. 10f. It is understood from the comparison between FIGS. 10a and 10f that, in the third embodiment, the S/N ratio of the interference signal obtained from the receiver 50 can be improved by using the beam reforming unit 46A.

Figure 9B:
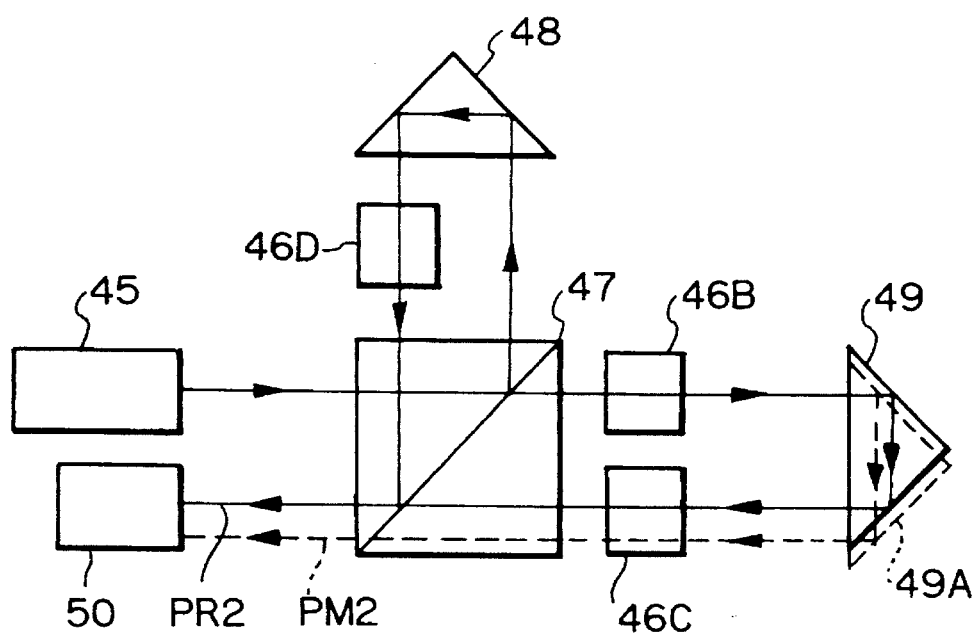
FIG. 9b is a similar view showing a modification of the third embodiment.

Furthermore, as shown in FIG. 9b, one Or more of beam reforming units 46B–46D can be arranged at the positions which are different from that of the beam reforming unit 46A in FIG. 9a. In FIG. 9b, parts corresponding to FIG. 9a are given the same reference numerals. The beam reforming unit 46B is arranged on a going path from the beam splitter 47 to the corner-cube 49, the beam reforming unit 46C is arranged on a returning path from the corner-cube 49 to the beam splitter 47, and the beam reforming unit 46D is arranged on a returning path from the corner-cube 48 to the beam splitter 47, respectively. It is also possible to use any one of the beam reforming units 46B–46D or use any two of them in combination.

In this case, the beam reforming units 46B, 46D mounted so as to expand the laser beam by the magnification ratio D/d along the travel direction of the laser beam as well as in the direction parallel to a sheer surface in FIG. 9b, which is the same as the case of the beam reforming unit 46A. On the contrary, the beam reforming unit 46C is mounted so as to contract the laser beam by the contraction ratio d/D along the travel direction of the laser beam as well as in the direction parallel to the sheet surface of FIG. 9b. That is, the beam reforming units 46B and 46D are mounted in the reverse direction to each other along the travel direction of the laser beam. As each beam reforming units 46A–46D, a pair of anamorphic prisms or a pair of cylindrical lenses, etc. can be used. Furthermore, if both of the beam reforming units 46B and 46C are used, they can be made into one part by arranging a pair of anamorphic prisms across both the going and returning paths at the position between the beam splitter 47 and the corner-cube 49.

Cross-sectional shapes and amounts of displacement of the laser beams obtained on the receiver 50 on condition that the beam reforming units 46B–46D are combined in various ways will be described with reference to FIGS. 10b–10e. In every figure, the reference beam is depicted by a reference beam PR2 of solid lines and the measurement beams is depicted by a measurement beam PM2 of dotted lines.

Figure 10B:
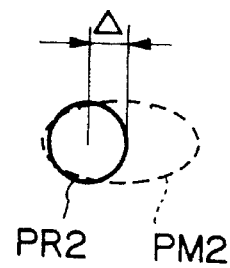
Figure 10C:
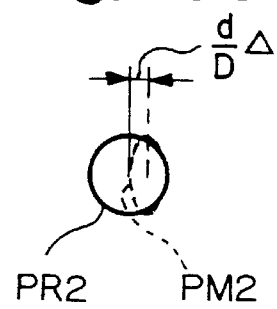
Figure 10D:
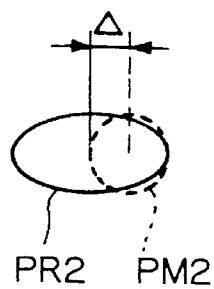

FIG. 10b shows a case in which only one beam reforming unit 46B is used. On an incident surface of the receiver 50, the measurement beam PM2 with an elliptic cross-sectional shape having the width D in the X-direction and the width d in the Z-direction is displaced by the distance Δ in the X-direction from the reference beam PR2 with a circular cross-sectional shape. FIG. 10c shows a case in which only one beam reforming unit 46C is used. On the incident surface of the receiver 50, the measurement beam PM2 with an elliptic cross-sectional shape having the width $d^2/D$ in the X-direction and the width d in the Z-direction is displaced by the distance (d/D).Δ in the X-direction from the reference beam PR2 with a circular cross-sectional shape. FIG. 10d shows a case in which only one beam reforming unit 46D is used. On the incident surface of the receiver 50, the measurement beam PM2 with a circular cross-sectional shape having the diameter d is displaced by the distance Δ in the X-direction from the reference beam PR2 with an elliptic cross-sectional shape having the width D in the X-direction and the width d in the Z-direction.

If any one of these beam reforming units 46B, 46C, 46D is used, an interference signal substantially similar to the case shown in FIG. 10f can be obtained, in said case in FIG. 10f no beam reforming unit being used. However, in the interferometer of the homodyne method, e.g., if the laser beam is split by the beam splitter 47 such that both amounts of light per unit area of the reference beam PR2 and the measurement beam PM2 on the incident surface of the receiver 50 in FIG. 9b are substantially equal to each other, a stronger interference signal can be obtained.

Figure 10E:
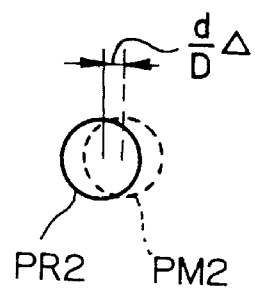
Figure 10F:
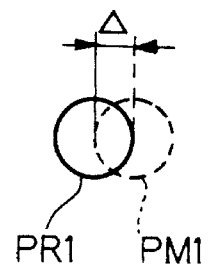

FIG. 10e shows a case in which both the beam reforming units 46B and 46C are used. On the incident surface of the receiver 50, the measurement beam PM2 with a circular cross-sectional shape having the diameter d is displaced by the distance (d/D).Δ in the X-direction from the reference beam PR2 with a circular cross-sectional shape having the diameter d. In this case, an interference signal similar to that in the case shown in FIGS. 9a and 10a can be used, in which FIGS. 9a and 10a the beam reforming unit 46A is used. Furthermore, if both the beam reforming units 46B and 46D are used, two laser beams obtained on the receiver 50 are like those shown in FIG. 10a. Therefore, it is obvious that it is possible to obtain the same effects as those in the case shown in FIG. 9a in which the beam reforming unit 46A is used.

Furthermore, the embodiments of FIGS. 9a and 9b refer to the case in which the measurement beam is displaced in the X-direction. Meanwhile, if the corner-cube 49 is displaced in the Z-direction, i.e., in the direction perpendicular to the sheet surface of FIGS. 9a and 9b, for example, it is possible to suppress undesirable effects caused by the displacement of the corner-cube 49 in the Z-direction by rotating the beam reforming unit 46A, 46B, 46C or 46D about the corresponding optical axis by 90°.

Furthermore, when a plurality of beam reforming units are used, although, in the above-mentioned embodiments, the beam reforming units with the same magnifications are combined, a plurality of beam reforming units with different magnifications can be combined.

Furthermore, in all the above-mentioned embodiments, all the laser beams each with an asymmetric cross-section are elliptic cross-section laser beams each with uniform optical intensity distribution in the corresponding cross-section. However, without being limited to them, a laser beam with a rectangular cross-sectional shape, a longer axis of which is in the direction of the displacement or another laser beam even with a circular cross-sectional shape, under the condition that the optical intensity distribution in the circular cross-sectional shape is asymmetric, can bring about the same effects as those in the above-mentioned embodiments. The reason for this is that a reduction rate of the interference intensity occurring when the beam is displaced in the predetermined direction can be made smaller than that occurring when the beam is displaced by the same distance in another direction.

Figure 11A:
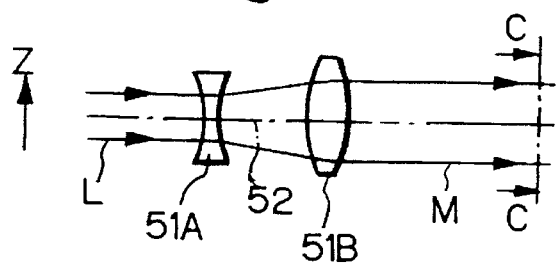
FIG. 11a is a view showing an optical path, whereby a laser beam with an asymmetrical close-sectional shape is obtained by using a pair of cylindrical lenses.
Figure 11B:
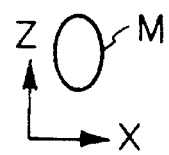
Figure 12:
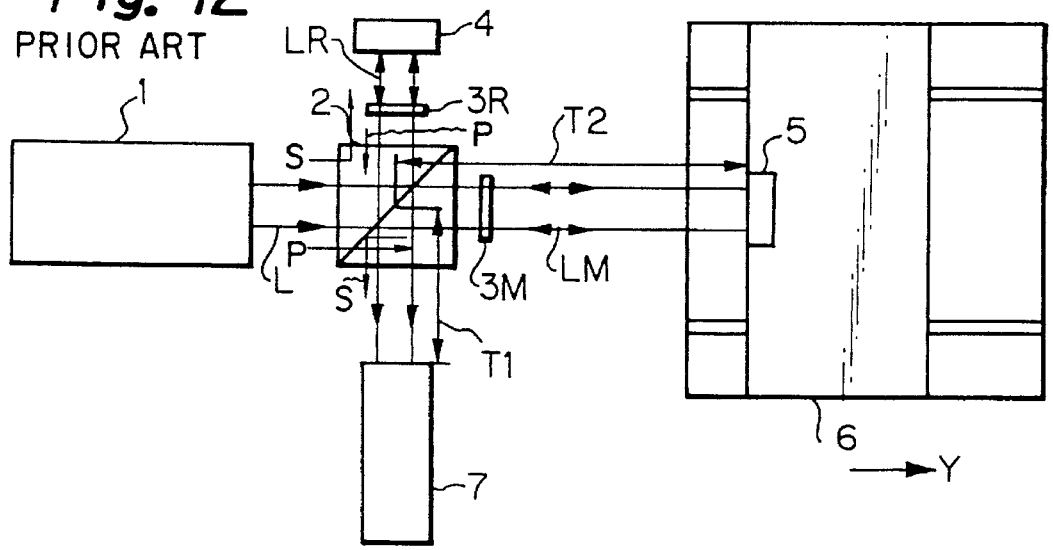
FIG. 12 is a plan view showing a stage device provided with a prior laser interferometer.
Figure 13:
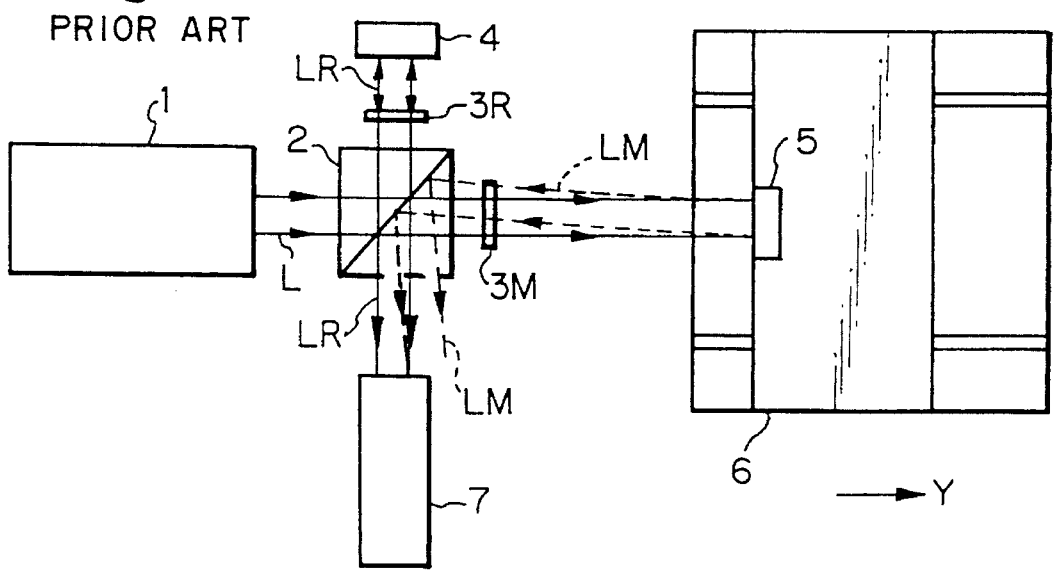
FIG. 13 is a plan view showing how the measurement beam is displaced in FIG. 12.
Figure 14:
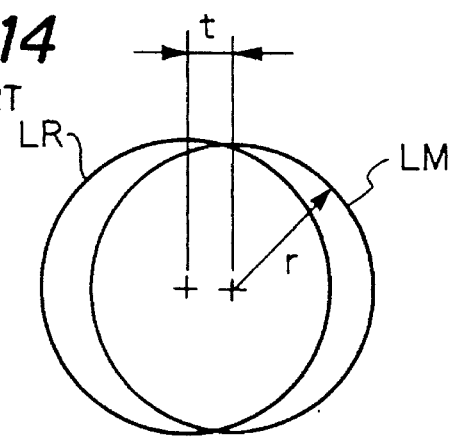
FIG. 14 is a view showing how the reference beam and the measurement beam are superposed in FIG. 13.

Furthermore, in place of the anamorphic prisms, as shown in FIG. 11a, a pair of cylindrical lenses 51A and 51B can be used in order to obtain a laser beam with an asymmetric cross-sectional shape. In FIG. 11a, the positive and negative cylindrical lenses 51A, 51B do not have refractive power in the direction perpendicular to the sheet surface in FIG. 11a (X-direction). Furthermore, focal depths of the cylindrical lenses 51A, 51B in a plane parallel to the sheet surface is taken as $-f_1$, $f_2$ ($f_1 < f_2$). Then, an entering laser beam L with a circular cross-sectional shape is converted, at the time of emission, into laser beam M, a cross-sectional shape of which is expanded in the Z-direction at the rate of $f_2/f_1$, as shown in 11b. When a pair of cylindrical lenses 51A, 51B are used in such a way, as the two laser beams L and M are aligned on one optical axis 52, an optical system can be arranged easily. Furthermore, while a beam expander of Galileo type comprising concave and convex cylindrical lenses 51A, 51B are used here, a beam expander of Kepler type comprising two convex cylindrical lenses can be alternatively used.

Furthermore, in place of anamorphic prisms or cylindrical lenses, a beam expander for expanding or contracting the light beam in the predetermined direction, or a slit plate having a long and narrow opening, or a combination of both of them can be used. That is, any optical member which can elongate or expand an area of the optical intensity distribution in the direction of the displacement of the light beam can be used, regardless of cross-sectional shapes of the beam.

Furthermore, as a reflection member for the double path system, in place of the corner-cube, a combination of two mirrors or two prisms can be used on condition that two reflecting surfaces thereof are substantially perpendicular to each other.

The interferometer in accordance with each of the above-mentioned embodiments is proper to be applied, for example, to an exposure apparatus used in a photolithography process for producing semiconductor elements, liquid crystal display elements or thin film magnetic heads, especially to a mask stage for mounting thereon masks or to a substrate stage for mounting thereon photosensitive substrates (for example, semiconductor wafers or glass plates, etc.) onto which patterns on the mask are transferred. As exposure apparatuses of such types, U.S. Pat. Nos. 5,214,489 and 5,243,195 disclose stepping and repeating type projection exposure apparatuses (so-called, stepper) for reducing a pattern image prepared on a mask via a projection optical system and for transferring a reduced image onto the substrate. In addition, U.S. Pat. No. 5,194,893 discloses a stepping and scanning type projection exposure apparatus for transferring a pattern image prepared on a mask onto a substrate by synchronously scanning the mask and the substrate at a speed ratio corresponding to the projection magnification of the projection optical system. In addition, U.S. Pat. No. 5,298,761 discloses a projection exposure apparatus for mounting a plurality of masks on a mask stage and driving both of the mask stage and substrate stage so as to connect a pattern images prepared on masks on the substrate, thereby, forming a pattern, on the substrate, larger than the image field of a projection optical system.

Furthermore, in the above-mentioned exposure apparatus, the fixed mirror 28 of the interferometer can be mounted on a mirror tube of the projection optical system.

The present invention is not limited to the above-mentioned embodiments, but can take other various constructions without deporting from the scope of the present invention defined by appended claims.

According to the present invention, it is advantageous that an area the optical intensity distribution of the cross-section of the light beam can be expanded or contracted in the predetermined direction, so that it is possible, without making the size of optical parts larger, to make the permissible amount of displacement between the first light beam (reference beam) and the second light beam (measuring beam) larger than that in the prior art.

Furthermore, in the case that the asymmetric conversion member is anamorphic prisms, there is hardly any undesirable effect exerted on the wave plane aberration of the light beam when the cross-sectional shape of the light beam is expanded or contracted by the anamorphic prisms, so that good interference measurement can be conducted.

Furthermore, in the case that asymmetric conversion member is a pair of cylindrical lenses, the entering beam and the emitted beam with a changed cross-sectional shape by the lenses are aligned substantially on the same axis, so that it may become easy to arrange a whole of optical system.

Furthermore, in the case that the asymmetric conversion member is arranged between the light source and the beam splitting member, the optical intensity distribution of the cross-section of all the light beams including the first light beam and the second light beam An the downstream of the asymmetric conversion member can be made asymmetric.

Furthermore, in the case that an asymmetric light source for generating the main light beam is used as the light source on condition that the optical intensity distribution of the cross-section is asymmetric, and that this asymmetric light source also serves as an asymmetric conversion member, a construction of the optical system can be simplified.

Furthermore, when the present invention is applied to an interferometer for the double path system, it is possible, without making the size of optical parts larger, to make the permissible amount of displacement between the first light beam (reference beam) and the second light beam (measurement beam) larger than that in the prior art.

What is claimed is:

1. An interferometric distance measuring apparatus comprising a light source for irradiating a main light beam;

a beam splitting member for splitting said main light beam into a first light beam and a second light beam;

a first reflection member and second reflection member for reflecting said first light beam and said second light beam, respectively;

an optical composition member for compositing said first light beam reflected by said first reflection member and said second light beam reflected by said second reflection member; and a photoelectric converter for receiving the composited light beam from said optical composition member;

whereby a relative displacement between said first reflection member and said second reflection member is detected based on a photoelectric conversion signal from said photoelectric converter, characterized in that said apparatus further comprises an asymmetric conversion member arranged on at least a portion of an optical path between the light source and the photoelectric converter, said asymmetric conversion member converting at least one beam, which is selected from a group of light beams including the main light beam irradiated from said light source, said first light beam and said second light beam, into a parallel luminous flux, and said asymmetric conversion member further converting a cross-sectional shape of said at least one beam into an asymmetric cross-sectional shape.

2. An apparatus as defined in claim 1, characterized in that said asymmetric conversion member is at least one anamorphic prism arranged on said optical path between said light source and said photoelectric converter.

3. An apparatus as defined in claim 1, Characterized in that said asymmetric conversion member is a pair 0f cylindrical lenses arranged on said optical path between said light source and said photoelectric converter.

4. An apparatus as defined in claim 1, characterized in that said asymmetric conversion member is arranged between said light source and said beam splitting member.

5. An apparatus as defined in claim 1, characterized in that, as said light source, an asymmetric light source for radiating said main light beam on condition that the cross-sectional Shape of the beam is asymmetric is used, and that said asymmetric light source therefore also serves as said asymmetric conversion member.

6. An apparatus as defined in claim 1, characterized in that said asymmetric cross-sectional shape of the beam is an ellipse, in which a ratio of a length thereof to a breadth thereof is about 2.

7. An apparatus as defined in claim 1, further comprising a third reflection member used for a double path type interferometric distance measuring apparatus, said third reflection member reflecting the first light beam reflected by the first reflection member as well as the second light beam reflected by the second reflection member to said optical composition member.

8. An apparatus as defined in claim 7, characterized in that said third reflection member is a corner-cube.

9. An interferometric distance measuring apparatus comprising:

a light source;

a beam splitter for splitting a laser beam irradiated from said light source into a first beam and a second beam;

a first mirror and a second mirror for reflecting said first beam and said second beam, respectively;

an optical composition member for compositing said first beam reflected by said first mirror and said second beam reflected by said second mirror;

a photoelectric detector for receiving the composited beam from said optical composition member;

a table carrying said second mirror and movable to a desired position: and an asymmetric conversion member converting at least one beam, which is selected from a group of light beams including the main light beam irradiated from said light source, said first light beam and said second light beam into a parallel luminous flux, said asymmetric conversion member further converting a cross-sectional shape of said at least one beam into an asymmetric cross-sectional shape, a direction of the asymmetric conversion of the cross-section of said at least one beam being dependent on a direction of a tilt of the table together with the second mirror so as to compensate for a displacement of the second beam reflected by the second mirror said displacement being caused by said tilt of the table.

10. An apparatus as defined in claim 9, wherein said asymmetric conversion member is at least one anamorphic prism or a pair of cylindrical lenses arranged between said light source and said photoelectric detector.

11. An apparatus as defined in claim 9, characterized in that said asymmetric cross-sectional shape of the beam is an ellipse, in which a ratio of a length thereof to a breadth thereof is about 2.

12. An interferometric distance measuring apparatus comprising:

a table movable to a desired position;

a first mirror;

a second mirror different from said first mirror and mounted on said table;

a light emitting system for projecting a laser beam to said first mirror and to said second mirror, respectively;

a light receiving system for receiving and compositing first and second laser beams reflected by said first and second mirrors, respectively; and a laser beam cross-section shaping member for shaping a cross-section of said laser beam into an asymmetric cross-sectional shape, such that a direction of shaping the cross-section of said laser beam is dependent on a direction of a tilt of the table together with the second mirror So as to compensate for a displacement of the second beam reflected by the second mirror, said displacement being caused by said tilt of the table.

13. An apparatus as defined in claim 12, characterized in that said asymmetric cross-sectional shape of the beam is an ellipse, in which a ratio of a length thereof to a breadth thereof is about 2.

* * * * *